US006670898B1

(12) United States Patent
Lifshitz

(10) Patent No.: US 6,670,898 B1
(45) Date of Patent: Dec. 30, 2003

(54) EFFICIENT METHOD AND APPARATUS FOR INTERLEAVING AND DE-INTERLEAVING DATA

(75) Inventor: Israel Lifshitz, Jerusalem (IL)

(73) Assignee: Tioga Technologies, Ltd., Tel Aviv (IS)

( * ) Notice: Subject to any disclaimer, the term of this patent is extended or adjusted under 35 U.S.C. 154(b) by 344 days.

(21) Appl. No.: 09/645,191

(22) Filed: Aug. 24, 2000

(51) Int. Cl.[7] .............................. H03M 7/00; H04L 1/00
(52) U.S. Cl. .......................................... 341/81; 714/701
(58) Field of Search ............................... 341/81; 714/701

(56) References Cited

U.S. PATENT DOCUMENTS

| 5,636,224 A | * | 6/1997 | Voith et al. ................... 714/701 |
| 6,442,728 B1 | * | 8/2002 | Cui et al. ...................... 714/786 |

* cited by examiner

*Primary Examiner*—R. Stephen Dildine
(74) *Attorney, Agent, or Firm*—Darby & Darby

(57) ABSTRACT

Presented is a method and system for interleaving or de-interleaving a datastream of codewords divided into indexed symbols including the step of allocating an electronic memory into a predetermined number of FIFOs equal to the desired depth (D) of the interleave operation. Thereafter, for each symbol of each codeword to be operated upon, the method and system performs the following: (1) determine a first operational index of the symbol corresponding to the position of the symbol within a non-interleaved codeword; (2) perform a first operation upon one of the FIFOs identified by the first operational index of the symbol and a first predetermined criteria defining the location of the symbol in the electronic memory; (3) determine a second operational index of a corresponding symbol in an interleaved codeword; and (4) perform a second operation upon one of the FIFOs identified by the second operational index and a second predetermined criteria defining the location of the corresponding symbol in the electronic memory. An additional embodiment wherein the interleaving and de-interleaving are performed on a codeword basis is also presented.

28 Claims, 6 Drawing Sheets

| i | k | m |
|---|---|---|
| 0 | 0 | 0 |
| 0 | 1 | 4 |
| 0 | 2 | 8 |
| 1 | 3 | 3 |
| 1 | 4 | 7 |
| 2 | 5 | 2 |
| 2 | 6 | 6 |
| 3 | 7 | 1 |
| 3 | 8 | 5 |

EFFICIENT METHOD AND APPARATUS FOR INTERLEAVING AND DE-INTERLEAVING DATA

FIELD OF THE INVENTION

The present invention relates generally to the field of data communications and in particular to a method and system for interleaving and de-interleaving data in a data communications system.

BACKGROUND OF THE INVENTION

Digital data communication systems are commonly used to transmit and receive data transmitted between remote transmitting and receiving locations. A central facet of any data communications system is the reliability and integrity of the data communicated. Ideally, the data, received at the receiving location should be identical to the data transmitted from the transmitting location. Practically however, a noisy transmission medium can cause the data which is being received to be corrupted or lost with respect to the originally transmitted data.

Early data communications systems utilized simple error detection and correction schemes to compensate for noise on a communications medium. A widely utilized method of error detection included the use of a parity bit in each block of transmitted data to indicate whether the particular block contained an odd or even number of high bits, i.e., bits equal to one. By determining whether the total number of high bits was even or odd and comparing the result to the value of the parity bit, a data receiver determined if the transmitted data blocks contained errors. This relatively simple scheme has numerous disadvantages such as its ability to detect only one inaccurate bit in a data block. Moreover, parity bit error detection cannot be used to correct a bit in error. Upon receiving a bit in error, a data receiver using parity bit error detection is limited to requesting retransmission of the data block in error from a data transmitter.

Other early methods and systems for error detection and correction included the use of a voting consensus circuit. Using a voting consensus circuit, a data transmitter transmitted a single data block multiple times to a data receiver. A data receiver included a voting circuit that would compare the multiple received versions of the same data block transmitted by the data transmitter and determine which, if any, of the transmitted data blocks was the correct, i.e., non-corrupted, data block. While a voting circuit reduced the number of retransmission requests issued by a transmitter as compared to a system utilizing parity bits, a voting consensus circuit system suffered from speed and throughput constraints due to repeated transmission of the same data.

The above-mentioned error correction and detection schemes are examples of binary block codes. More particularly, an (n,k,d) binary block code includes a series of $2^k$ binary codewords of block length n and minimum distance d, i.e., coding distance. Using binary block codes, a datastream to be transmitted is partitioned into binary blocks of length k which are then mapped into binary codewords of length n and then modulated and transmitted through a communication medium. As is known in the art, these schemes are limited to correcting up to $(d-1)/2$ bit errors within each codeword.

The limitations of the above-described systems become evident when considering the nature of noisy transmission media. Frequently, noise in a communications medium occurs in non-frequent bursts. Thus, where blocks of data are transmitted in sequence, a burst of noise may corrupt a block of data beyond the capabilities of the above-mentioned schemes to correct the errors, i.e., a burst of noise may corrupt more than $(d-1)/2$ bits of data in a codeword, thus rendering error correction schemes, such as those described above, ineffective.

Interleaver/de-interleaver systems have been developed to address and compensate for the effects of noise bursts over transmission media. An interleaver accepts a datastream to be transmitted and interleaves or co-mingles the data from several codewords in a predetermined manner such that the co-mingled data can be re-organized and the datastream reconstructed by a de-interleaver at the receiving end. In other words, instead of transmitting a succession of complete codewords, the interleaver transmits a portion (also referred to as a symbol), e.g., a byte, of a first codeword then transmits a portion of a second codeword and so on. By processing a datastream through an interleaver before it is modulated and transmitted through a communications media or channel, the effects of non-periodic noise bursts are minimized because noise encountered in the transmission medium is distributed among several codewords of the reconstructed or de-interleaved datastream.

An interleaver/de-interleaver system requires two known values, the total number of symbols (N) in each codeword of the non-interleaved datastream and the depth (D) of the interleaver. The size of a symbol is measured in bits and is preferably equal to one byte, i.e., eight bits. The depth of the interleave (D) represents the total number of non-interleaved codewords that are represented in any one interleaved codeword.

Viewing a simple interleaver/de-interleaver system logically, the symbols of the datastream to be transmitted are written to an (N,D) two dimensional memory of the interleaver in columns and are read out from the two dimensional memory of the interleaver in rows. The write and read operations are performed in groups of symbols rather than being alternated between each symbol. This type of interleaving is known in the art as block interleaving and introduces a latency in transmission of one (N*D) block at the interleaver. Furthermore, block interleaving requires two blocks of memory (2*N*D) at the interleaver and two blocks of memory (2*N*D) at the de-interleaver.

Thus, it can be seen from the above description of block interleaving that an interleaver/de-interleaver system requires memory storage units to store symbols at both the transmitting (interleaving) end and the receiving (de-interleaving) end of the transmission medium. Because the codewords in an interleaved datastream are not arranged in the same sequential time order as the non-interleaved datastream, an interleaver requires a sufficient amount of memory to store the input symbols of the non-interleaved codewords which are not immediately transmitted in the interleaved datastream. Similarly, a de-interleaver requires a sufficient amount of memory to store the input symbols of the interleaved codewords which are not immediately placed into the non-interleaved datastream. Memory requirements are, therefore, an important factor to be considered in designing interleaver/de-interleaver systems.

One type of prior art interleaver/de-interleaver system and method which reduces the amount of necessary memory over that required in block interleaving is a convolutional interleaver/de-interleaver system and method disclosed by John L. Ramsey in "Realization of Optimum Interleaver", *I.E.E.E. Transactions on Information Theory*, Vol. IT-16, No. 3, May 1970, which is hereby incorporated herein by reference in its entirety. In convolutional interleaving and de-interleaving, the write and read operations of the interleaver and de-interleaver are alternated on a symbol basis rather than being carried out in groups of symbols as in block interleaving.

Each of the convolutional interleaving techniques described by Ramsey utilizes a tapped shift register and a commutator to accomplish the convolutional interleaving described therein. More particularly, four techniques for convolutional interleaving are described by Ramsey. As discussed therein, the convolutional techniques known in the art at that time, although achieving minimum possible end to end latency, were wasteful of storage insofar as, during the interleaving process, many of the symbols stored in later shift register stages were already read into the output sequence of the convolutional interleaver. Ramsey described a technique of reducing the required storage capacity of a convolutional interleaver without changing the functionality of the convolutional interleaver. Furthermore, the convolutional interleaver disclosed by Ramsey reduces the amount of memory required in an interleaver or a de-interleaver to (0.5*N*D) symbols, i.e., ¼ that required by block interleaving.

As is known in the art, modern convolutional interleaver/de-interleaver systems and methods, such as that disclosed in U.S. Pat. No. 5,636,224 of Voith, et al., which is hereby incorporated by reference herein in its entirety, utilize electronic memory in conjunction with control logic as memory storage units in interleavers and de-interleavers rather than shift registers and commutators. The memory units in an interleaver are configured in an electronic memory as First In First Out (FIFO) buffers to which symbols of the input non-interleaved datastream are written and from which symbols of the interleaved datastream are read. Likewise, the memory units in a de-interleaver are configured in an electronic memory as FIFOs to which symbols of the input interleaved datastream are written and from which symbols of the non-interleaved datastream are read. More particularly, N FIFOs are utilized in each of the interleaver and de-interleaver.

Implementing FIFOs in addressable electronic memory requires that addresses, pointers and boundaries be calculated and stored for each of the FIFOs. Essentially, the complexity, the memory occupied and the process power required with the prior art approach, is directly proportional to N. What is desired, therefore, is a convolutional interleaver/de-interleaver method and system that utilizes a minimal number of FIFOs.

SUMMARY OF THE INVENTION

In accordance with a first embodiment of the present invention, a method for interleaving or de-interleaving a datastream of codewords divided into indexed symbols includes allocating an electronic memory into a predetermined number of FIFOs equal to the desired depth (D) of the interleave operation. Thereafter, for each symbol of each codeword to be operated upon, the method performs the following: (1) determines a first operational index of the symbol corresponding to the position of the symbol within a non-interleaved codeword; (2) performs a first operation upon one of the FIFOs identified by the first operational index of the symbol and a first predetermined criteria defining the location of the symbol in the electronic memory; (3) determines a second operational index of a corresponding symbol in an interleaved codeword; and (4) performs a second operation upon one of the FIFOs identified by the second operational index and a second predetermined criteria defining the location of the corresponding symbol in the electronic memory.

In accordance with a second embodiment of the present invention, a method for interleaving or de-interleaving a datastream of codewords divided into indexed symbols includes allocating an electronic memory into a predetermined number of FIFOs equal to the desired depth (D) of the interleave operation. Thereafter, for each codeword to be operated upon, the method performs the following: (1) for each of the symbols in the codeword, (a) determines a first operational index of the symbol corresponding to the respective position of the symbol within a non-interleaved codeword, and (b) performs a first operation upon one of the FIFOs identified by the first operational index of the symbol and a first predetermined criteria defining the location of the symbol in the electronic memory; and (2) for each of the symbols of the codeword, (a) determines a second operational index of a corresponding symbol in an interleaved codeword, and (b) performs a second operation upon one of the FIFOs identified by the second operational index and a second predetermined criteria defining the location of the corresponding symbol in the electronic memory.

A first embodiment of an interleaver system according to the present invention includes: (1) an electronic memory which is configured into a predetermined number of FIFOs wherein each FIFO outputs data in the order in which data is input; (2) an input port which receives a non-interleaved datastream of input codewords divided into indexed symbols; (3) an output port which transmits an interleaved datastream of output interleaved codewords; and (4) a control unit which configures the electronic memory into one of a predetermined number of FIFOs of predetermined size, the predetermined number of FIFOs being equal to the depth of the desired interleave. For each of the input symbols, the control unit further:

a) determines a first operational index of the symbol;
  b) writes the symbol in one of the FIFOs identified by the first operational index using a first predetermined criteria defining the location of the symbol in the electronic memory;
  c) determines a second operational index of a corresponding output symbol; and
  d) reads a symbol stored in one of the FIFOs identified by the second operational index using a second predetermined criteria defining the location of the corresponding symbol in the electronic memory.

A second embodiment of an interleaver system according to the present invention includes: (1) an electronic memory which is configured into a predetermined number of FIFOs wherein each FIFO outputs data in the order in which data is input; (2) an input port which receives a non-interleaved datastream of input codewords divided into indexed symbols; (3) an output port which transmits an interleaved datastream of output codewords; and (4) a control unit which configures the electronic memory into one of a predetermined number of FIFOs of predetermined size, the predetermined number of FIFOs being equal to the desired depth of the interleave. For each of the input codewords, the control unit further:

a) for each of the symbols of the input codeword,
    i) determines a first operational index of the symbol, and
    ii) writes the symbol into a FIFO identified by the first operational index of the symbol using a first predetermined criteria defining the location of the symbol in the electronic memory; and b) for each of the symbols of the output codeword,
  i) determines a second operational index of the output symbol; and
  ii) reads a symbol stored in a FIFO identified by the second operational index using a second predetermined criteria defining the location of the symbol in the electronic memory.

A first embodiment of a de-interleaver system according to the present invention includes: (1) an electronic memory which is configured into a predetermined number of FIFOs wherein each FIFO outputs data in the order in which data is input; (2) an input port which receives an interleaved datastream of input codewords divided into indexed symbols; (3) an output port which outputs a non-interleaved datastream of output codewords; and (4) a control unit which configures the electronic memory into one of a predetermined number of FIFOs of predetermined size, the predetermined number of FIFOs being equal to the desired depth of the interleave. For each of the output symbols, the control unit further:

a) determines a first operational index of the symbol;
b) reads the symbol from the FIFO identified by the first operational index using a first predetermined criteria defining the location of the symbol in the electronic memory;
c) determines a second operational index of a corresponding input symbol; and
d) writes an input symbol to one of the FIFOs identified by the second operational index using a second predetermined criteria defining the location of the corresponding symbol in the electronic memory.

A second embodiment of a de-interleaver system according to the present invention includes: (1) an electronic memory which is configured into a predetermined number of FIFOs wherein each FIFO outputs data in the order in which data is input; (2) an input port which receives an interleaved datastream of input codewords divided into indexed symbols; (3) an output port which outputs a non-interleaved datastream of output codewords; and (4) a control unit which configures the electronic memory into one of a predetermined number of FIFOs of predetermined size, the predetermined number of FIFOs being equal to the desired depth of the interleave. For each of the output codewords, the control unit further:

a) for each of the symbols of the output codeword,
  i) determines a first operational index of the symbol, and
  ii) reads the symbol of the output codeword from a FIFO identified by the first operational index of the symbol using a first predetermined criteria defining the location of the symbol in the electronic memory; and
b) for each of the symbols of the input codeword,
  i) determines a second operational index of the input symbol; and
  ii) writes a symbol to a FIFO identified by the second operational index using a second predetermined criteria defining the location of the symbol in the electronic memory.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENT

In general, the interleaver and de-interleaver of the present invention each include D First In First Out buffers (FIFOs) to which symbols of each codeword are written and from which symbols of each codeword are read. D represents the desired depth of the interleave, i.e., the desired number of non-interleaved codewords that are represented in any one interleaved codeword.

In the case of an interleaver, the symbols the non-interleaved codewords to be transmitted are spread out into D output interleaved codewords. In the interleaver described herein, the symbols of each non-interleaved codeword are written to predetermined FIFOs. Each input symbols group, which corresponds to a specific interleaved codeword, incurs a predetermined delay measured in units of codewords until it is read out.

In the case of a de-interleaver, the received symbols are spread out among D interleaved codewords. In the de-interleaver described herein, the received symbols are written to predetermined FIFOs, with the internal order of the input symbols in the specific FIFO being maintained while being read out. Each symbols group incurs a predetermined delay measured in units of codewords until it is read out.

The system and method of the present invention are implemented in any number of communications or other related schemes where high efficiency and robust data transfer are necessary, e.g., in embedded telecommunications systems, modems, and other wire-line and non-wireline signal transfer applications. The system may be implemented in embedded applications or as part of a larger data communications system.

The system and method described herein utilize any of the processors known in the art (e.g, a central processing unit (CPU) or digital signal processor (DSP)) or may alternately be hardware implemented, e.g., using an application specific integrated circuit (ASIC) or field programmable gate array (FPGA). The system and method may utilize cache memory resident on the processor or may, more commonly, utilize interconnected electronic memory (e.g., RAM, DRAM or hardware FIFOs) to meet memory requirements.

The methods disclosed herein are implemented using any of the programming conventions known in the art, e.g., C, C++, BASIC, etc., a chip-specific programming language, or a combination thereof to implement the data interleave/de-interleave system described herein. Likewise, conventional programming techniques or more advanced programming styles such as, for e.g., object-oriented programming techniques may be used.

Figure 1:
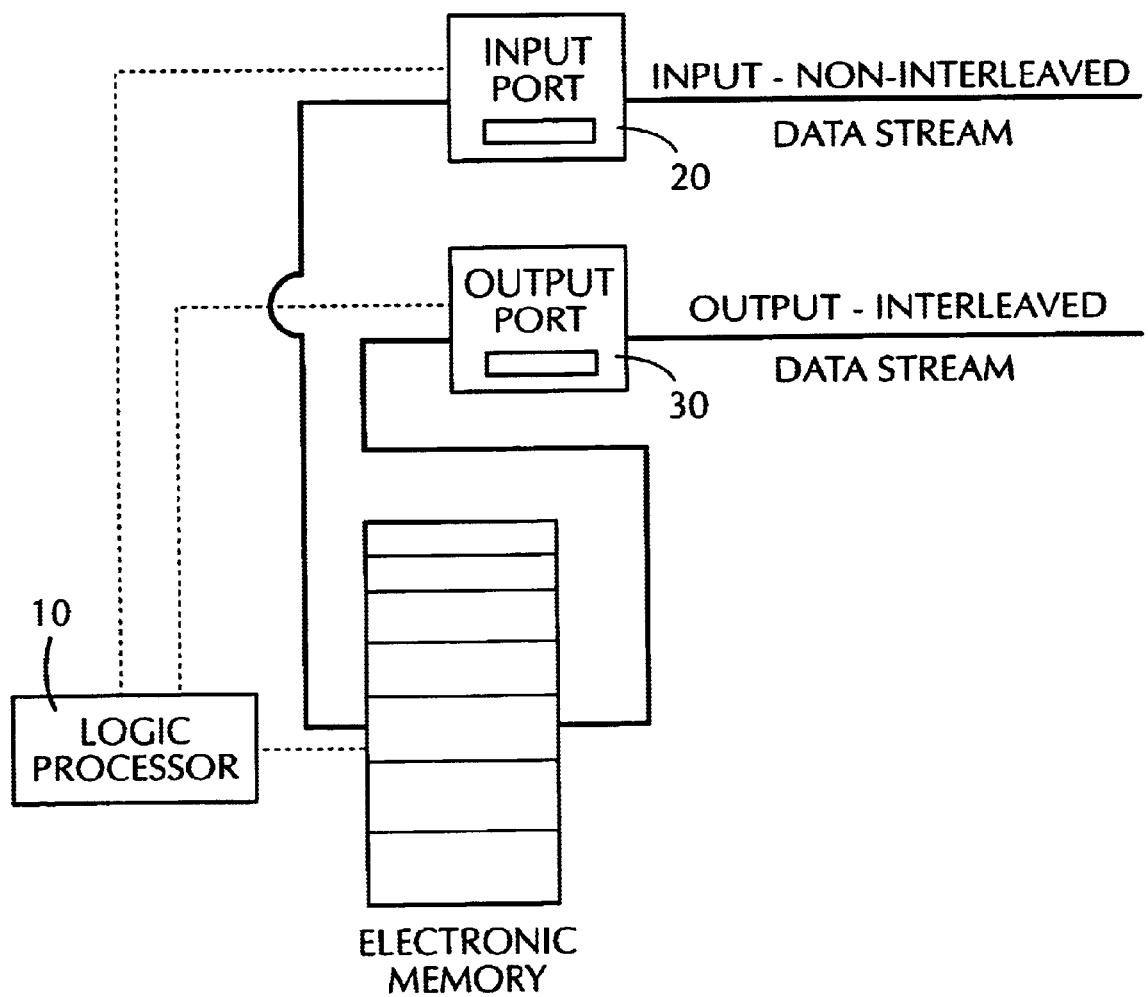
FIG. 1 illustrates a comparison between a Matrix, N FIFOs and D FIFOs implementations of a Convolutional Interleaver.

One embodiment of the present invention is shown in FIG. 1. The system presented in FIG. 1 may be used as either an interleaver or a de-interleaver, with the de-interleaver essentially performing the inverse process of the interleaver. Accordingly, identical types of hardware may be used to construct both the interleaver and the de-interleaver.

As shown in FIG. 1, a control unit 10 performs the necessary logic and control functions for the interleaver and de-interleaver systems described herein. For example, control unit 10 performs all mathematical calculations, controls addressing functionality and maintains timing requirements to provide (in the case of an interleaver) proper processing of input non-interleaved and output interleaved data.

An input port 20 and an output port 30 are provided to facilitate the input and output and transmission of the datastreams. The input and output ports 20 and 30 operate in conjunction with the control unit 10 to control the rate of transmission and also to provide for any necessary conversion of data between different input and output formats. It is understood that, although the ports are represented in FIG. 1 as unique physical embodiments, the functionality of the ports may be embedded in control unit 10 or in other types of software, hardware or firmware implementations without the need for a separate hardware embodiment.

An electronic memory 40 is provided in the present system in the form of RAM, DRAM, hardware FIFOs or any other suitable electronic memory capable of interacting with control unit 10 and input and output ports 20 and 30. Control unit 10, e.g., of an interleaver, may use electronic memory 40 to logically create FIFOs into which input non-interleaved data is written and from which output interleaved data is read. It is understood that although electronic memory 40 is represented in FIG. 1 as a unique physical embodiment, the functionality of electronic memory 40 may alternately be embodied in, e.g., control unit 10 with sufficient memory storage space.

Furthermore, the system and method of implementing FIFOs in electronic memory 40 utilize any of the systems and methods known in the art. For example, indexing arrays and array addressing boundaries may be used to create and move data into and out of FIFOs created in electronic memory as in U.S. Pat. No. 5,636,224 which is incorporated herein by reference. As an alternate example, FIFOs may be implemented using discrete logic circuits.

In one embodiment according to the present system and method, the input datastream to be interleaved is divided into codewords (or frames) which comprise both payload data (information) and error-checking data, e.g., as in ADSL standard ITU-T Recommendation G. 992.1 (ex G. dmt) ASYMMETRICAL DIGITAL SUBSCRIBER LINE (ADSL) TRANSCEIVERS which is hereby incorporated herein by reference in its entirety. Each codeword is further preferably divided into 1 byte (8 bit) symbols. The present method and system utilize codewords which are subdivided into bytes, allowing for efficient reading and writing of bytes into and out of memory units whose structure is based on an 8 bit/1 byte construction. This implementation is not meant to limit the scope of the present invention to byte-wise divided payloads. Rather, it is understood that other techniques known in the art of dividing the payloads may likewise be used with the present invention.

Each symbol (or byte) in any codeword is represented by two operational indexes. A first operational index represents the sequential relation of the symbol to the other symbols in the non-interleaved codeword (i.e., in an input datastream of an interleaver or an output datastream of a de-interleaver). Accordingly, each symbol is represented by an index (k) indicating the symbol's relative position in the non-interleaved codeword. For example, the first symbol in a non-interleaved codeword to be written to an interleaver has a first operational index equal to 0 (k=0), the first symbol in an output codeword from a de-interleaver has a first operational index equal to 0 (k=0). Also, each codeword preferably begins with a flag indicating the start or beginning of a codeword.

A second operational index represents the sequential relation of the symbol to the other symbols in an interleaved codeword (i.e., an output codeword from an interleaver or an input codeword to a de-interleaver). Accordingly, each byte, in addition to being represented by index k, is also represented by an index m where index m represents the symbol's relative position in an interleaved codeword. For example, the first symbol in an output interleaved codeword from an interleaver has an m index equal to 0 (m=0), the first symbol in an input interleaved codeword to a de-interleaver has an m index equal to 0 (m=0).

As will be fully explained hereinafter, there is a one-to-one correspondence between the indexes k and m of a symbol. The one-to-one correspondence is used to facilitate the convolutional interleaving of the present invention.

In a first embodiment of the present invention, the interleaver system first identifies the FIFO to which the input symbol of data from the non-interleaved datastream must be written using the first operational index (k) and a first predetermined criteria explained below. After writing that symbol to the proper FIFO, the system identifies the FIFO from which to read the next symbol for the output interleaved datastream using a second operational index (m) and a second predetermined criteria explained below. Once the FIFO is identified, the system reads a symbol from the FIFO and places it in the output interleaved datastream. This alternating write/read cycle continues for so long as a datastream is sent to the interleaver.

In a second embodiment of the present invention, rather than alternating writing and reading operations on a symbol or byte-wise basis, the method and system alternates the writing and reading operations on a codeword basis. In other words, each and every symbol of an input non-interleaved codeword are written to the respective FIFOs using each symbols' k index and the abovementioned first predetermined criteria and, thereafter, a group of symbols sufficient to form a complete output codeword are read from respective FIFOs using each symbols' m index and the abovementioned second predetermined criteria. This alternating codeword-based write/read cycle continues for so long as a datastream is sent to the interleaver.

In a first embodiment of the de-interleaver of the present invention, the de-interleaver system first identifies the FIFO from which an output symbol of data from the de-interleaver is to be read using the first operational index (k) and a first predetermined criteria explained below. After reading that symbol to the output codeword, the system identifies the FIFO to which the next input symbol of the input interleaved codeword is to be written using a second operational index (m) and a second predetermined criteria explained below. Once the FIFO is identified, the system writes the input symbol to the identified FIFO. This alternating read/write cycle continues for so long as an interleaved datastream is sent to the de-interleaver.

In a second embodiment of the de-interleaver present invention, rather than alternating reading and writing operations on a symbol or byte-wise basis, the method and system alternates the reading and writing operations on a codeword basis. In other words, each and every symbol of an output non-interleaved codeword are read from the respective FIFOs using each symbols' k index and the abovementioned first predetermined criteria and, thereafter, a complete group of symbols forming a complete input codeword are written to respective FIFOs of the de-interleaver using each input symbols' m index and the abovementioned second predetermined criteria. This alternating codeword-based read/write cycle continues for so long as an interleaved datastream is sent to the de-interleaver.

As will be explained fully below, both embodiments (i.e., symbol-based and codeword-based interleaving and de-interleaving) are similar in that, using either symbol-based or codeword-based embodiments corresponding symbols are written to and read from the same FIFOs. As will be fully explained below, the only difference between the two embodiments (other than the fact that one operates on a symbol basis while the other operates on a codeword basis) is that the two embodiments have different memory requirements.

Furthermore, the scope of the present invention is not limited to symbol-based or codeword-based embodiments. Rather, it is understood that interleaving and de-interleaving may be accomplished by embodiments of the present invention that are not symbol-based or codeword-based. Where such interleaving and de-interleaving is utilized, memory requirements of the FIFOs must be varied accordingly.

Figure 2:
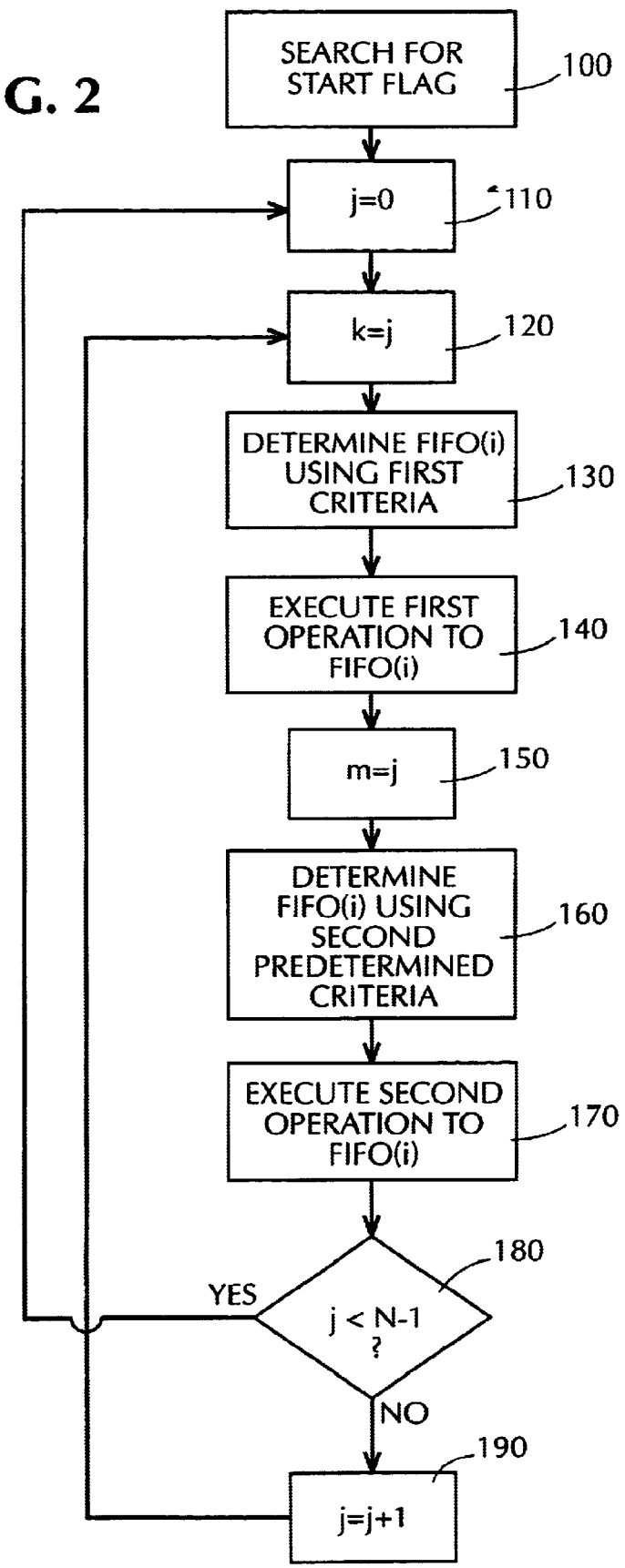
FIG. 2 illustrates an example of Convolutional Interleaver/De-Interleaver symbols streams for a codeword length of N=9 symbols and an interleave depth D=4 codewords.

Turning to FIG. 2, the method of writing indexed bytes to and reading indexed bytes from the proper FIFO using the first embodiment of the present invention is illustrated. As will be fully explained below, in the case of an interleaver, the system and method calculates the FIFO to which the input symbol is to be written, i.e., the system calculates FIFO(i), where i identifies the particular FIFO, using the above-mentioned first operational index and the first predetermined criteria. The system, thereafter, calculates the FIFO (i) from which a symbol is to be read using the above-mentioned second operational index and the second predetermined criteria.

In the case of a de-interleaver, the system and method calculates the FIFO from which an output symbol is to be read, i.e., the system calculates FIFO(i), using the above-mentioned first operational index and the first predetermined criteria. The system, thereafter, calculates the FIFO(i) to which a symbol is to be written using the above-mentioned second operational index and the second predetermined criteria.

With continued reference to FIG. 2, at step 100, the system (either an interleaver or a de-interleaver of the present invention) reads input codewords and searches for a pre-pended flag indicating the start of a new codeword. Upon detection of a new codeword in step 100, the system continues at step 110 and creates a variable j in memory and sets the value of j to 0. j is used to keep track of the number of symbols that have been written to or read from a particular codeword.

At step 120, the system sets a first operational index k to the value of j. As explained above, k is the index representing a symbol's position in a non-interleaved codeword. In other words, k represents a symbol's position in time relative to the other symbols in a non-interleaved codeword. More particularly, in the case of an interleaver, k represents the position of a symbol in an input codeword while in the case of a de-interleaver, k represents the position of a symbol in an output codeword. The k value of a symbol is constant in that its k value before entering the interleaver, after leaving the interleaver, before entering the de-interleaver and after emerging from the de-interleaver is the same. As an example, a k index whose value is equal to 0 is the first symbol in a non-interleaved codeword. The possible values of k range from 0 to N−1, where N is equal to the total number of symbols in a codeword.

At step 130, the system determines FIFO(i) using the first operational index k and a first predetermined criteria. In the case of an interleaver, the system at step 130 identifies the FIFO in the interleaver memory to which the present symbol identified by the index k is to be written and, in the case of a de-interleaver, at step 130, the system identifies the FIFO from which the next symbol of the de-interleaved codeword is to be read.

One method for calculating FIFO(i) at step 130 includes the use of the following equation:

$$\text{FIFO}(i)=(D*k)\text{DIV}(N) \qquad (1)$$

where FIFO(i) corresponds, in the case of an interleaver, to the particular FIFO to which the symbol having the index value k is to be written or, in the case of a de-interleaver, to the particular FIFO from which a the symbol having the index value k is to be read, D corresponds to the interleave depth and is equal to the total number of FIFOs required for an interleaver or de-interleaver of the present invention, and N corresponds to the total number of symbols in each codeword. The mathematical operation DIV is the integer number result of the division of a dividend (i.e., D*k) by a divisor (i.e., N). The remainder is not included, i.e., it is dropped.

At step 140, the system executes a first operation to the FIFO(i) identified in step 130. In the case of an interleaver, the system at step 140 writes the input symbol presently being examined into the FIFO identified at step 130. In the case of a de-interleaver, the system reads the output symbol from FIFO(i) identified at step 130.

At step 150, in the case of an interleaver, the system begins the process of determining from which FIFO the next output symbol for interleave transmission is to be read. In the case of a de-interleaver, step 150 begins the process for determining to which FIFO of the de-interleaver the next input interleaved symbol is to be written.

To calculate the next symbol to be read in the case of an interleaver or the next symbol to be written in the case of a de-interleaver, the system utilizes the second operational index m and the second predetermined criteria as fully explained herein below.

The system sets the second operational index m to j at step 150.

At step 160, the system calculates FIFO(i) using the second predetermined criteria.

The process to determine the second predetermined criteria of step 160 begins by finding the corresponding k value for the present m value. As previously explained, the second operational index m of a symbol represents the symbol's position in an interleaved codeword. The relationship between the first operational index k, i.e., a symbol's position in a non-interleaved codeword and the second operational index m, i.e., the same symbol's position in an interleaved codeword, is fixed and can be described by the following equation:

$$m=(D*k)\bmod(N) \qquad (2)$$

where k and m range from 0 to N−1. The mathematical operation "mod" is the remainder resulting from the division of a dividend (i.e., D*k) by a divisor (i.e., N). As an example (where N=9 and D=4), the symbol in the second position in a non-interleaved codeword (i.e., k=1) is in the fifth position in an interleaved codeword (i.e., m=4).

What is ultimately desired, however, is the identification of the FIFO containing a symbol whose position in an interleaved codeword is j. In other words, what is desired at step 160, in the case of an interleaver, is the FIFO(i) having a symbol whose m value is equal to j. Likewise, in the case of a de-interleaver, what is desired at step 160, is the identification of FIFO(i) to which an input symbol is to be written whose m value is equal to j.

As explained above, equation (2) defines the relation between the first operational index, i.e., the non-interleaved symbol index k and the second operational index, i.e., the interleaved symbol index m. Because there is a one-to-one correspondence between the values of k and m, equation (2) is invertible such that f(m)=k. Accordingly, by solving equation (2) for all values of k (i.e., for k=0 to N−1) a corresponding table of m values may be calculated and stored in, e.g., an array of memory. This array of memory may serve as a look-up table for use at step 160 such that, as will be illustrated by example hereinafter below, the system, at step 160 references the lookup table to determine the corresponding k value of the symbol whose m value is equal to j.

Once this value is determined, i.e., once the corresponding k value for the present m value is found, the system may calculate the FIFO(i) from which data is to be read in the case of an interleaver and to which data is to be written in the case of a de-interleaver using equation (1) above; i.e., knowing the k value of the desired symbol, FIFO(i) is calculated using the following equation:

$$\mathrm{FIFO}(i)=(D*k)\mathrm{DIV}(N)=(D*f(m))\mathrm{DIV}(N) \qquad (3)$$

where k represents the corresponding k value of the present m value.

At step 170, the system executes the second operation to FIFO(i). In the case of an interleaver, the second operation includes reading the symbol at the beginning of the queue in FIFO(i) into the interleaved datastream while, in the case of a de-interleaver, the operation includes writing the next input symbol from the interleaved datastream into FIFO(i) of the de-interleaver.

The system then proceeds to step 180 and determines whether the present value of j is less than N−1, i.e., whether the last symbol operated upon by the system was the last symbol of the codeword. If j is less than N−1, then the system returns to step 110 to begin the process of FIG. 2 again. If the last symbol operated upon was not the last symbol of the codeword, the system first increments the value of j (step 190) and then returns to step 120 to operate on the next symbol of the codeword.

Figure 3:
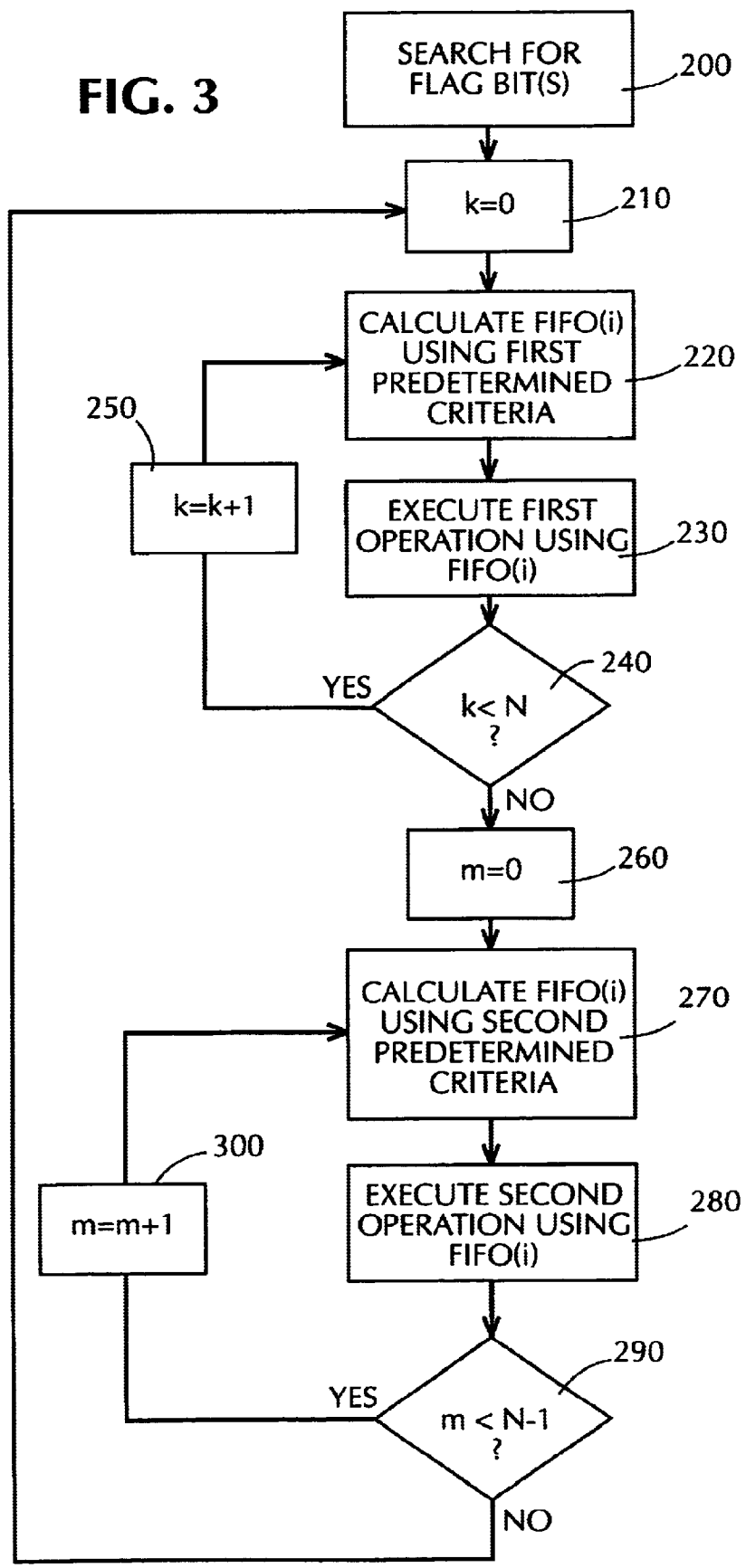
FIG. 3 is an illustration of a Convolutional Interleave Matrix implementation corresponding to the example of FIG. 1.

FIG. 3 illustrates a second embodiment of the present method and system wherein data is written to and read from an interleaver and de-interleaver in codewords rather than in symbols.

With reference to FIG. 3, steps 220 through 250 define a subprocess for writing codewords to an interleaver and reading codewords from a de-interleaver while steps 260 through 290 define a subprocess for reading codewords from an interleaver and writing codewords to a de-interleaver.

The process shown in FIG. 3 proceeds in a similar fashion to the process illustrated in FIG. 2, until step 240. At step 240, the system determines whether the value of k is less than N−1. In other words, the system at step 240 determines whether the last symbol operated upon was the last symbol of the interleaved codeword. If it was (i.e., if k is not less than N−1), the system proceeds to step 260. If, however, the last symbol operated upon was not the last symbol of the interleaved codeword (i.e., if k is less than N−1), the system increments k by one at step 250 and returns to step 220 to determine the next FIFO(i) to or from which the next input symbol of the present codeword is to be written or read, respectively. Thus, it is seen, using the embodiment illustrated in FIG. 3, the system will write all of the symbols of an input non-interleaved codeword to their respective FIFOs in the case of an interleaver or, read all of the symbols of an output non-interleaved codeword in the case of a de-interleaver, before the system proceeds to execute the second operation.

With continued reference to FIG. 3, once all of the symbols of the codeword have been operated upon by the subprocess defined by steps 210 through 250, the system, at step 260, in the case of an interleaver, begins the process of reading an interleaved codeword of symbols into a datastream from interleaver memory or, in the case of de-interleaver, begins the process of writing an interleaved codeword of symbols from a datastream to the de-interleaver memory.

At step 260, the second operational index m is set to 0. Steps 270 and 280 proceed similar to steps 160 and 170 of FIG. 2. However, if at step 290 of FIG. 3, the system determines that m is less than N−1, i.e., that the last symbol operated upon was not the last symbol of the interleaved codeword, the system increments m by 1 (step 300) and returns to step 270 to calculate FIFO(i) for the next input symbol. Thus, it is seen that using the embodiment illustrated in FIG. 3, the system will read all of the symbols of an output interleaved codeword from their respective FIFOs in the case of an interleaver or, write all of the symbols of an input interleaved codeword in the case of a de-interleaver, before the system proceeds to again execute the first operation.

In accordance with the present invention, each symbol of each input codeword corresponding to a particular symbol of an output codeword and incurring a pre-determined delay of codewords until read out, are written to a particular FIFO. In accordance with the system and method above, the first group of symbols of an input non-interleaved codeword are written to FIFO(0), the next, i.e., second, group of consecutive symbols of an input non-interleaved codeword are written to FIFO(1) and so on. In other words, writing input symbols of a non-interleaved codeword to the appropriate FIFO may be accomplished by writing Xi consecutive input symbols to FIFO(i), where i increments from 0 to D−1, beginning with the first symbol of the codeword written to FIFO(0). In accordance with this alternate embodiment, Xi represents the number of consecutive input symbol elements to be consecutively written to FIFO(i) where Xi is calculated using the following equation:

$$X_i = 1 + (((i+1)*N - 1) DIV\ D) - \sum_{j=0}^{i-1} X_j \qquad (4)$$

where, when i=0

$$\sum_{j=0}^{i-1} X_j == 0;$$

where, $$\sum_{j=0}^{i-1}$$

Xj equals the sum of all elements whose indexes range from 0 to i−1 (i.e., less than i) and i ranges in value from 0 to D−1.

Accordingly, in an alternate embodiment of step 130 in the system and method of FIG. 2 and step 220 of the system and method of FIG. 3, the system may determine the appropriate FIFO by predetermining the total number of consecutive symbols to be written to (interleaver) or read from (de-interleaver) each FIFO(i). Preferably, the values of Xi are preliminarily calculated and stored as an array of D elements such that, during each pass through step 130 or step 220, the system may determine upon which FIFO the operation of step 140 or step 230 is to be performed.

The size of each FIFO(i) for an interleaver depends upon each input symbol group which corresponds to a specific output and its corresponding output codeword, as well as upon the predetermined delay (measured in terms of codewords) incurred by the input group until they are read out. The size of FIFO(i) for an interleaver may be calculated for either of the methods illustrated in FIGS. 2 or 3 using the following equation:

$$FIFOsize(i)=Xi*(i+1) \qquad (5)$$

where Xi is calculated for each FIFO(i) using equation (4) above.

However, when using the system and method of FIG. 2, less memory and, therefore, greater memory efficiency may be realized for an interleaver.

Figure 4:
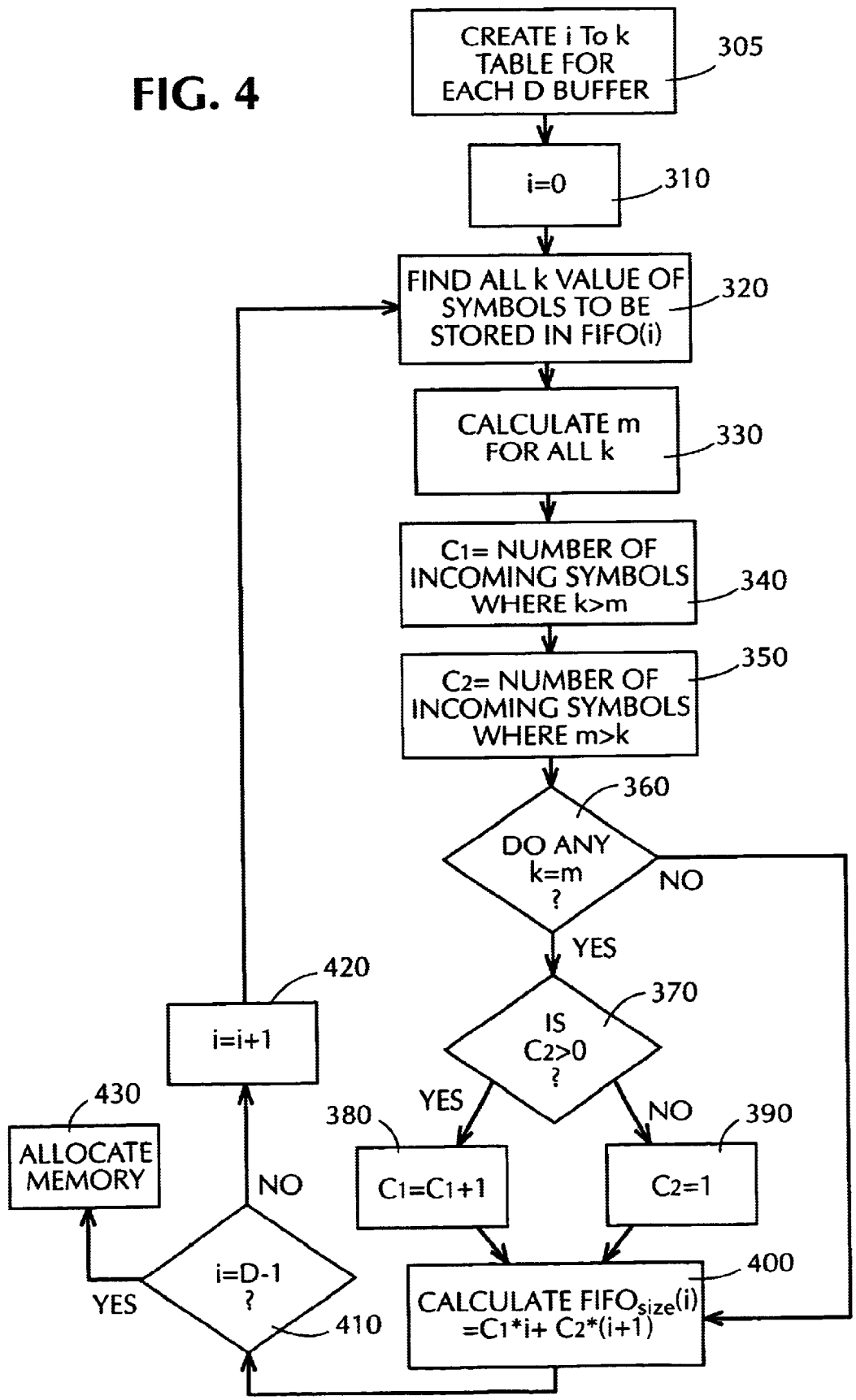
FIG. 4 is an illustration of a Convolutional Interleave N FIFO's implementation corresponding to the example of FIG. 1.

FIG. 4 illustrates a method of calculating the particular size of each of the D FIFOs for a more efficient scheme which requires less memory than the method described using equation (5) above. The method described by FIG. 4, however, can not be utilized with the method and system of FIG. 3.

Referring now to FIG. 4, the process begins at step 305 where the system creates a reference table correlating each of the D FIFOs and their respective input symbol index values (k) using equation (1) described above. In other words, the system creates a table which lists, for each of the FIFOs, the corresponding symbol(s) or byte(s) (represented by their respective k indexes) which will be stored in that buffer during the interleaving process.

At step 310, the system creates a variable i in memory and sets it to 0. i is used to represent the index of the FIFO whose size is being calculated. The value of i ranges from 0 to D−1.

At step 320, the system references the table created in step 305 and determines the respective k values of the symbols that will be stored in FIFO(i). Thereafter, in step 330, the system calculates the corresponding value of m, for each value of k that will be stored in FIFO(i) using equation (2) above.

At step 340, the system calculates a variable C1 by counting the number of symbols (if any) for which k is greater than the corresponding value m for the FIFO(i) whose size is presently being calculated.

Conversely, at step 350, the system calculates the value of a variable C2 by counting the number of input symbols (if any) for which k is less than the corresponding value of m for the FIFO(i) whose size is presently being calculated.

At step 360, the system determines whether any one of the symbols to be stored in the FIFO(i) whose size is presently being calculated has the same k and m value. If not, the system proceeds to step 400 and calculates the size of FIFO(i).

However, if at step 360, the system determines that there is a symbol having the same value for k and m for the FIFO(i) being considered, the system proceeds to step 370 and determines whether C2 (as calculated in step 360) is greater than 0. If it is, the system proceeds to step 380 and increments the value of C1 (as calculated in step 380) by 1.

In contrast, if, at step 370, the system determines that C2 is not greater than 0 (i.e., C2=0), the value of C2 is set to 1 (step 390).

From step 380 or 390, the system then proceeds to step 400 and references the values of C1 and C2 to calculate the size of the FIFO(i) using the following equation:

$$FIFO_{size}(i)=C1*i+C2*(i+1) \qquad (6)$$

where the size of the FIFO is measured in units equal to the size of one symbol. For example, where a symbol is equal to one byte, the size of the FIFO is measured in units of bytes. Using the procedure of FIG. 4, the value of C1+C2 will always equal Xi as calculated in equation (4).

The system thereafter stores the value obtained in equation (6) and, at step 410, determines whether the value i equals the value of D−1. In other words, the system determines whether the immediately preceding FIFO for which the size was calculated was the last FIFO for which such a calculation is required. If it was, the system proceeds to step 440 and allocates the required memory for each FIFO using any of the methods known in the art.

If however, the value of i does not equal D−1, the system, at step 420, increments i by 1 and calculates the size of the next FIFO starting at step 320.

The above-described methods for calculating the size of the FIFOs need only be performed once preliminarily where N and D will remain constant during the interleave/de-interleave process.

As explained, the de-interleaver performs the reverse process of that performed by the interleaver. The effect of the combined interleaver/de-interleaver operation is to delay the original symbol sequence by N*D symbols. At the very least, therefore, N*D symbols must be stored in either the interleaver or the de-interleaver. Accordingly, the first symbol in a codeword which incurs no delay in the interleaver, incurs the maximum delay (N*D symbols) in the de-interleaver. More particularly, symbol j in a codeword, which incurs a delay of j*(D−1) symbols in the interleaver, incurs a delay of N*D−j*(D−1) in the de-interleaver. Additionally, as was also previously explained above with reference to FIGS. 2 and 3, while the first operation as described in FIGS. 2 and 3 for an interleaver is a write operation and the second operation is a read operation, the opposite is true for a de-interleaver according to the present invention. For de-interleaver, the first operation is a read operation and the second operation is a write operation. Furthermore, the size of the FIFOs in the de-interleaver varies in reverse order to those of the interleaver.

The size of the FIFOs of a de-interleaver using either of the methods of FIGS. 2 or 3 may be calculated using the following equation:

$$\text{FIFOsize}(i) = Xi*(D-i) \quad (6)$$

where i ranges from 0 to D−1.

However, the memory requirements of a de-interleaver utilizing the method illustrated in FIG. 2 may be reduced using the following procedure.

For the sequentially $X_i$ consecutive output symbols which are to be read out from FIFO(i), where k is the output symbol index, and m is the corresponding input symbol index, the system:

1. calculates the value of the variable C1 by counting the number of symbols in which k is greater than or equal to m;
2. calculates the value of the variable C2 by counting the number of symbols in which k is less than m.
3. calculates the size of FIFO(i) using the following equation:

$$\text{FIFO}_{size}(i) = C1*(D-i) + C2*(D-1-i) \quad (7)$$

The value of C1+C2 will always equal Xi as calculated in equation (4).

Figure 5:
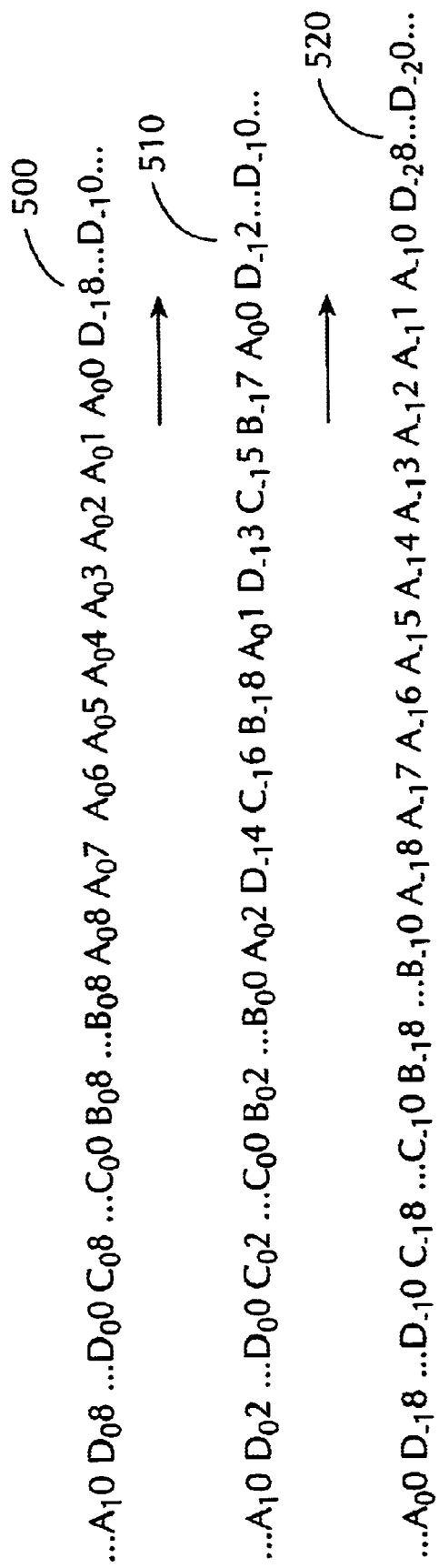
FIG. 5 is an illustration of a Convolutional Interleave D FIFO's implementation corresponding to the example of FIG. 1.
Figures 6, 7:
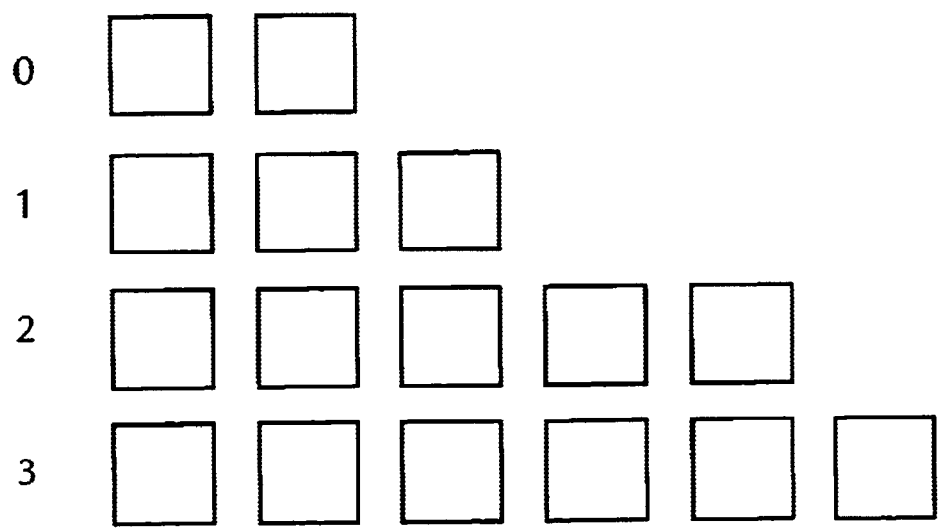
FIG. 6 is an exemplary illustration a stream of data during interleaving and de-interleaving in accordance with the invention.
FIG. 7 is an exemplary logical representation of four FIFOs that are needed to implement the method of the invention.

An example of the present method and system is illustrated in FIGS. 5 through 7.

FIG. 5 is an example of a stream of data during the interleaving and de-interleaving processes of the present invention where N=9 and D=4; i.e., where the number of symbols in a codeword is 9 and the depth of the interleave is 4. Symbols in the same codeword are represented by the same prefixes (e.g., symbols having the prefixes $A_0$ belong to the same codeword). For ease of illustration and understanding, the first prefix representing a codeword is repeated every four codewords (equal to the depth of the interleave, D=4). Thus, e.g., the codeword $C_{-1}$ has a position that is four codewords ahead of codeword $C_0$ in an interleaved datastream. Furthermore, each symbol is appended with an index (corresponding to index k described above) representing the symbol's position in the codeword (e.g., symbol $A_0 2$ is the third symbol in the codeword $A_0$).

Datastream 500 is a logical representation of an example of portions of a non-interleaved datastream as they are input into an interleaver of the present invention from left to right. As is shown, symbols of the same codeword are placed into the interleaver sequentially in order of their indexed position within the codeword. Because the size of each codeword, N, is equal to 9 the symbols are indexed from 0 through 8.

Datastream 510 is a logical representation of an interleaved portion of datastream 500 as that interleaved datastream logically appears on a communications medium at substantially the same instant of time as that represented in datastream 500. In other words, the symbol in datastream 510 that is in vertical alignment with a symbol of datastream 500 represents the symbol that is transmitted on the communications medium by the interleaver immediately after the symbol of datastream 500 is read into the interleaver. As can be seen, the first symbol of each codeword (e.g., $D_{-1}0$, $A_0 0$, $D_0 0$, $A_1 0$) encounters no delay in transmission, while the remaining symbols of each codeword encounter varying delays in transmission.

Datastream 520 is a logical representation of a non-interleaved portion of datastream 500 as that non-interleaved portion logically appears at the output of a de-interleaver of the present invention at substantially the same instant of time as that represented in datastream 510. In other words, the symbol in datastream 520 that is in vertical alignment with a symbol of datastream 510 represents the symbol that is output by the de-interleaver immediately before the symbol of datastream 510 is written into the de-interleaver. As can be seen, each non-interleaved codeword output by the de-interleaver is delayed by four codewords (equal to the desired depth D of the interleave).

Thus, datastream 520 represents the datastream output from the de-interleaver of the present invention. As is shown, the order of the symbols and codewords of datastream 520 is the same as that of datastream 500, i.e., the output of the de-interleaver is the same as the input of the interleaver, except that the output is delayed by four codewords.

To implement the present method of data interleaving and de-interleaving in the present example, the system first calculates the size of each FIFO of the interleaver and de-interleaver to be created in memory. FIFO size calculation in an interleaver will be further described by way of example.

With reference to FIG. 4, the system at step 305 calculates the i FIFO values for each k byte or symbol, i.e., the system determines, for each k symbol of each input codeword, the FIFO into which that symbol is stored during the interleaving process.

As is shown in FIG. 5, the present example uses codewords which each contain nine (9) bytes or symbols (i.e., k ranges from 0 to 8). Accordingly, the system at step 310 of FIG. 4 processes the equation:

For $k=0$ to 8

$$\text{FIFO}(i) = (D*k) \text{DIV } N$$

where D is equal to the total number of buffers to be created (4), and N equals the total number of symbols (9) in each codeword.

A logical representation of a table generated by the above calculation is illustrated in FIG. 6 wherein it is shown that k indices 0, 1, and 2 correspond to FIFO(0), k indices 3 and 4 correspond to FIFO(1), k indices 5 and 6 correspond to FIFO(2) and k indices 7 and 8 correspond to FIFO(3).

The system next proceeds to step 310 of FIG. 4 where a variable i is created and set to 0. i represent the FIFO whose size is presently being calculated. At this point, the size of the first FIFO (i.e. the FIFO having index 6) will be calculated.

At step 320, the system references the table created in step 310 and illustrated in FIG. 6 to determine the k indices which correspond to the first buffer (i=0). As is shown in FIG. 6, and as explained above, k values 0, 1 and 2 correspond to the first FIFO (FIFO(0)).

At step 330, the system calculates a corresponding m value for each k value related to the present i buffer using the equation:

$$m = (D*k) \bmod N \quad (9)$$

which yields an m value of 0 corresponding to k value 0, m value 4 corresponding to k value 1 and m value 8 corresponding to k value 2. As shown in FIG. 6, the system writes the m values to their respective location in the table created at step 305.

At step 340, the system calculates the variable C1 by referencing the table created in step 305 and updated in step 330, as illustrated in FIG. 6 and counts, for the present i value, the number of instances where a k value is greater in number than its corresponding m value. In this example, none of the k values exceed their corresponding m value (k values 1 and 2 do not exceed their corresponding m values 4 and 8 while the k value 0 is equal to its corresponding m value.) Accordingly, the variable C1 is stored with a value 0.

In step 350, the system calculates the variable C2 by referencing the table created in step 305 and updated in step 330, as illustrated in FIG. 6 and counts the number of instances where a m value is greater in number than its corresponding k value. In this example, two of the m values are greater than their corresponding k values (m values 4 and 8 exceed their corresponding k values 1 and 2 while the k value 0 is equal to its corresponding m value.) Accordingly, the variable C2 is stored with a value 2.

In step 360 the system determines whether any of the k values are equal in value to its corresponding m value. In this example, one k value (0) is equal to its corresponding m value.

Accordingly, the system proceeds to step 370 where the system references the value of C2 stored in memory and determines whether C2 is greater in value than 0. In this example C2 (which was calculated in step 350) has a value of 2 which is greater than 0. Therefore, following the method illustrated in FIG. 4, the system proceeds to step 380 and increments the value of C1 (as calculated in step 340) by 1. Accordingly, C1, which was calculated as having a value 0 in step 340, is set to a value of 1.

The system next proceeds to step 400 where the size of FIFO i is calculated using the following equation:

$$\text{FIFO}_{size}(i) = C1*i + C2*(i+1) \tag{10}$$

or in this case:

$$\text{FIFO}_{size}(0) = 1*0 + 2*(0+1) = 2 \tag{11}$$

In other words, the system calculates that FIFO(0) must be capable of storing two symbols (or bytes) of data. The system stores the requisite size in memory.

At step 410, the system determines whether it has calculated the size of all of the respective FIFOs by comparing the value of i to D−1, which in this case corresponds to comparing 0 to 3. Here, because the values are not equal, the system proceeds to step 320 wherein i is incremented by one so that the size of the next buffer (i=1) can be calculated starting at step 320.

FIG. 7 illustrates a logical representation of the four FIFOs needed to implement the example of the present invention where D=4 and N=9. In FIG. 7, each block of memory capable of storing a symbol is represented by a block. As was calculated above, the size of the first FIFO (FIFO(0)) is 2 symbols or 2 bytes where each symbol is equal to one byte. Accordingly, two blocks are shown allocated to the first FIFO. Using the method illustrated in FIG. 4, the requisite sizes of the remaining three FIFOs (i=1, 2, and 3) are calculated to be 3, 5 and 6 symbols, respectively, as illustrated in FIG. 7.

Continuing with the present example, the method of interleaving the input datastream 500 of FIG. 5 by writing input symbols to, and reading stored symbols from the FIFOs illustrated in FIG. 7 is described in accordance with the present invention.

With reference to FIG. 2, the process begins at step 100 where the system accepts the input datastream and searches for a pre-pended flag indicating the start of a codeword. Upon detecting the flag, the system, at step 110, creates and sets a variable j to 0. The system then proceeds to step 120 and creates and sets a variable k to the value of j.

At step 130, the system determines the FIFO into which the present symbol being examined is to be written by calculating the equation:

$$\text{FIFO}(i) = (D*k)\text{DIV } N \tag{12}$$

which in the present example equates to:

$$\text{FIFO}(0) = (4*0)\text{DIV } 9 \tag{13}$$

Accordingly, at step 130, the system writes the first byte in the codeword (which has a k index equal to 0) to FIFO(0), i.e., to the first FIFO.

At step 150, the system creates and sets a variable m to the value of j.

With continued reference to the present example and the process illustrated in FIG. 2, the system determines the corresponding k value equal to the present m value, in order to determine from which FIFO(i) the output symbol for interleave transmission is to be read. To accomplish this, the system first determines the k value of the symbol having an m value corresponding to the first position in an interleaved codeword, i.e, the system must determine the k value of a symbol whose m value=0.

The system at this point either references an already existing table of m values and corresponding k values (e.g., the table created in step 305 of FIG. 4) or creates and stores such a table if one does not exist, using the equation:

$$m = (D*k) \bmod N \tag{14}$$

for k=0 to N−1, i.e., k=0 to 8, which in the present example equates to:

$$0 = (4*0) \bmod 9 \tag{15}$$

$$4 = (4*1) \bmod 9 \tag{16}$$

$$8 = (4*2) \bmod 9 \tag{17}$$

$$3 = (4*3) \bmod 9 \tag{18}$$

$$7 = (4*4) \bmod 9 \tag{19}$$

$$2 = (4*5) \bmod 9 \tag{20}$$

$$6 = (4*6) \bmod 9 \tag{21}$$

$$1 = (4*7) \bmod 9 \tag{22}$$

$$5 = (4*8) \bmod 9 \tag{23}$$

With the above corresponding values of k and m stored in a table of electronic memory, the system now determines the k value of a symbol having an m value equal to 0. As can be see in equation (15) above, the corresponding k value of a symbol having an m value of 0 is 0. Thus, the system determines that the symbol to be read into the first position of the output codeword has a k value equal to 0.

The system now determines the FIFO(i) of the interleaver memory where the symbol having a k value equal to 0 is stored using the equation:

$$\text{FIFO}(i) = (D*k)\text{DIV } N \tag{24}$$

which, in the present example, equates to:

$$\text{FIFO}(0) = (4*0)\text{DIV } 9 \tag{25}$$

Thus, the symbol having a k index equal to 0 is located in FIFO(0).

Accordingly, at step 170, the system reads a symbol from FIFO (0), i.e., from the first FIFO of the interleaver memory, into the output interleaved codeword.

At step 180, the system determines whether the symbol most recently operated upon was the last symbol of the output interleaved codeword by determining whether j is less than N. In the present example, the system determines that the value of j (i.e., j=0) is less than N (i.e., N=8) and, therefore, proceeds to step 190 to increment j by 1 and return to step 120 to repeat the above-described process for the second symbol in the input non-interleaved codeword and the second symbol in the output interleaved codeword.

Furthermore, the procedure described above is performed for all of the symbols in the input codeword (i.e., for k=0 to 8) and all of the symbols of the output codeword resulting in the following write/read series of commands.

WRITE Input symbol with k=0 to FIFO(0)

| | |
|---|---|
| READ | Symbol from FIFO(0) to the output codeword |
| WRITE | Input symbol with k = 1 to FIFO(0) |
| READ | Symbol from FIFO(3) to the output codeword |
| WRITE | Input symbol with k = 2 to FIFO (0) |
| READ | Symbol from FIFO(2) to the output codeword |
| WRITE | Input symbol with k = 3 to FIFO(1) |
| READ | Symbol from FIFO(1) to the output codeword |
| WRITE | Input symbol with k = 4 to FIFO(1) |
| READ | Symbol from FIFO(0) to the output codeword |
| WRITE | Input symbol with k = 5 to FIFO(2) |
| READ | Symbol from FIFO(3) to the output codeword |
| WRITE | Input symbol with k = 6 to FIFO(2) |
| READ | Symbol from FIFO(2) to the output codeword |
| WRITE | Input symbol with k = 7 to FIFO(3) |
| READ | Symbol from FIFO(1) to the output codeword |
| WRITE | Input symbol with k = 8 to FIFO(3) |
| READ | Symbol from FIFO(0) to the output codeword |

Of course, for ease of programming and to increase efficiency, the system may compute the above equations and related commands once and thereafter store the resulting series of write/read commands or the information necessary to implement them. The stored commands are thereafter referenced by the system on each pass through the write/read process without performing each of the calculations required in steps 130 and 160 because the resulting commands will always be the same on each pass through the process of FIG. 2 where the value of N and D remain constant.

For continued purposes of illustration, where the procedure illustrated in FIG. 3 is utilized, the resulting series of write and read commands will appear as follows:

| | |
|---|---|
| WRITE | Input symbol with k = 0 to FIFO(0) |
| WRITE | Input symbol with k = 1 to FIFO(0) |
| WRITE | Input symbol with k = 2 to FIFO (0) |
| WRITE | Input symbol with k = 3 to FIFO(1) |
| WRITE | Input symbol with k = 4 to FIFO(1) |
| WRITE | Input symbol with k = 5 to FIFO(2) |
| WRITE | Input symbol with k = 6 to FIFO(2) |
| WRITE | Input symbol with k = 7 to FIFO(3) |
| WRITE | Input symbol with k = 8 to FIFO(3) |
| READ | Symbol from FIFO(0) to the output codeword |
| READ | Symbol from FIFO(3) to the output codeword |
| READ | Symbol from FIFO(2) to the output codeword |
| READ | Symbol from FIFO(1) to the output codeword |
| READ | Symbol from FIFO(0) to the output codeword |
| READ | Symbol from FIFO(3) to the output codeword |
| READ | Symbol from FIFO(2) to the output codeword |
| READ | Symbol from FIFO(1) to the output codeword |
| READ | Symbol from FIFO(0) to the output codeword |

As the above series of commands illustrate, an interleaver operating in conformance with the procedure of FIG. 3 first writes all of the symbols of an input codeword and, thereafter, reads all of the symbols from the appropriate FIFOs to an output codeword.

The disclosed system and method utilize D FIFOs rather than N FIFOs to store and read out the symbols of each codeword. Furthermore, the present method and system achieves the minimum possible end to end latency and reduces the required combined storage capacity to approximately 0.5*(N*D) storage elements (symbols) at the interleaver, and the same at the de-interleaver. Moreover, by using D FIFOs as opposed to N FIFOs, the present invention reduces the total overhead which has to be added in an addressable electronic memory-based interleaver/de-interleaver implementation.

The determination of D, i.e., the depth of the interleave, is based on several factors such as the maximum amount noise to which the system will be exposed, the overall delay of the system and the amount of available memory. Furthermore, the depth of the interleaver optimally approximates the maximum amount of data errors the system is expected to encounter, divided by the number of errors that can be corrected by the particular coding scheme being used. This insures that the coding scheme is not overwhelmed by a number of errors it cannot handle. In other words, the determination of the size of the codeword (N), the depth of the interleave (D) and the block code correcting capability (t), should satisfy the condition that N divided by D is less than or equal to t. As an example, in the ADSL standard, the depth of the interleave (D) is a power of two that varies up to 64, while the size of the codeword (N) may be equal to 255 symbols.

In interleave/de-interleave systems which utilize FIFOs, the addresses, pointers and boundaries that must be calculated and/or stored for each of the FIFOs, is directly proportional to the number of FIFOs utilized. Accordingly, an interleave/de-interleave system which utilizes D FIFOs as opposed to N FIFOs is advantageously less complex, and less memory and processing intensive when the D/N ratio is less than 1, as in ADSL, where the ratio is 64/255.

In certain data transmission systems and standards, the depth of the interleaver is constrained to be a power of two. Utilizing this fact may facilitate an efficient execution. However, the principles of the present invention are also applicable and advantageous to interleaver/de-interleavers having a depth not constrained to be a power of two. The present invention is similarly applicable to a de-interleaver.

Although the preferred embodiments have been disclosed for illustrative purposes, those skilled in the art will appreciate that many additions, modifications and substitutions are possible without departing from the scope and spirit of the invention as defined by the accompanying claims.

What is claimed is:

1. A method for interleaving or de-interleaving a datastream of codewords divided into indexed symbols comprising the steps of:

(a) allocating an electronic memory into a predetermined number of FIFOs equal to a desired depth (D) of the interleave operation; and (b) for each symbol of each codeword to be operated upon, the method further comprises the steps of:

(1) determining a first operational index of said symbol corresponding to the position of said symbol within a non-interleaved codeword;

(2) performing a first operation upon one of said FIFOs identified by the said first operational index of said symbol and a first predetermined criteria defining the location of said symbol in said electronic memory;

(3) determining a second operational index of a corresponding symbol in an interleaved codeword; and (4) performing a second operation upon one of said FIFOs identified by said second operational index and a second predetermined criteria defining the location of said corresponding symbol in said electronic memory.

2. The method of claim 1, wherein said allocating step comprises the additional step of calculating the size of each of said predetermined number of FIFOs.

3. The method of claim 2, wherein said allocating step comprises the step of assigning to each of said predetermined number of FIFOs a portion of electronic memory in accordance with said calculating step.

4. The method of claim 2 wherein said calculating step for an interleaver includes the step of calculating the equation:

FIFOsize($i$)=$X_i$*($i$+1)

for each of said predetermined number of FIFOs, wherein i represents the logical position of one of each of said predetermined number of FIFOs and Xi is calculated for each of said positions using the equation:

$$Xi = 1 + (((i+1)*N-1)DIV\ D) - \sum_{i=0}^{i-1} X_j$$

wherein N represents that total number of symbols in any codeword, $$\sum_{i=0}^{i-1}$$

$X_j$ is the sum of elements whose indexes range from 0 to i−1 and wherein $$\sum_{i=0}^{i-1} X_j == 0 \text{ when } i = 0.$$

5. The method of claim 2 wherein said calculating step for an interleaver includes the step of calculating the equation:

FIFOsize($i$)=$C1$*$i$+$C2$*($i$+1)

for each of said predetermined numbers of FIFOs wherein i represents the logical position of one of each of said predetermined number of FIFOs.

6. The method of claim 5, including the additional steps of:
calculating, for each of said predetermined number of FIFOs, all possible values of the first operational index of the one or more symbols to be stored in said FIFO;
calculating a corresponding second operational index for each of said possible values of said first operational index;
determining the number of instances (C1) in which the values of said first operational index exceeds the values of said corresponding second operational index;
determining the number of instances (C2) in which the values of said first operational index is less than the values of said corresponding second operational index;
determining whether any of the values of said first operational index equal any of the values of said corresponding second operational indexes; and
if any of the values of said first operational index equal any of the values of said corresponding second operational indexes, performing the additional step of:

determining whether C2 exceeds 0;
incrementing C1 by 1 if C2 exceeds 0; and
setting C2 equal to 1 if C2 does not exceed 0.

7. The method of claim 2, wherein said calculating step for a de-interleaver comprises the step of calculating the equation:

FIFOsize($i$)=$Xi$*($D$−1)

for each of said predetermined number of FIFOs, wherein i represents the logical position of one of each of said predetermined number of FIFOs and $X_i$ is calculated for each of said logical positions using the equation:

$$X_i = 1 + (((i+1)*N-1)DIV\ D) - \sum_{i=0}^{i-1} X_j$$

wherein N represents the total number of symbols in any codeword, $$\sum_{i=0}^{i-1}$$

$X_j$ is the sum of elements whose indexes range from 0 to i−1 and wherein $$\sum_{i=0}^{i-1} X_j == 0 \text{ when } i = 0.$$

8. The method of claim 2 wherein said calculating step for a de-interleaver includes the step of calculating the equation:

FIFOsize($i$)=$C1$*($D$−1)+$C2$*($D$−1−$i$)

for each of said predetermined number of FIFOs wherein i represents the logical position of one of each of said predetermined number of FIFOs.

9. The method of claim 8 including the additional steps of:
calculating for each of said predetermined number of FIFOs, all possible values of the first operational index of one or more symbols to be stored in said FIFO;
calculating a corresponding second operational index for each of said possible values of said first operational index;
determining the number of instances (C1) in which the value of said first operational index exceeds or is equal to the value of said corresponding second operational index; and
determining the number of instances (C2) in which the values of said first operational index is less than the values of said corresponding second operational index.

10. The method of claim 1, wherein said first predetermined criteria includes the step of calculating:

FIFO($i$)=($D$*$k$)DIV $N$ wherein i represent the logical position of one of each of said predetermined number of FIFOs, k represents said first operational index and N represents the total number of symbols in any codeword.

11. The method of claim 1, wherein said first operation includes the step of reading a symbol from one of said predetermined number of FIFOs in the case of an interleaver and writing a symbol to one of said predetermined number of FIFOs in the case of a de-interleaver.

12. The method of claim 1, wherein said second operational index represents the position of said symbol to be operated upon in an interleaved codeword.

13. The method of claim 12, wherein said second operational index is calculated using the equation:

$$m = (D*k) \bmod (N)$$

wherein m represents said second operational index; k represents said first operational index and N represents the total number of symbols in any codeword.

14. The method of claim 12 wherein said second predetermined criteria includes the additional step of:

identifying the one of said predetermined number of FIFOs containing a symbol having said second operational index.

15. The method of claim 1, wherein said second operation comprises the step of writing a symbol from one of said predetermined number of FIFOs in the case of an interleaver and reading a symbol from one of said predetermined number of FIFOs in the case of a de-interleaver.

16. The method for interleaving or de-interleaving a datastream of codewords divided into indexed symbols comprising the steps of:

(a) allocating an electronic memory into a predetermined number of FIFOs equal to a desired depth (D) of the interleave operation; and (b) for each codeword to be operated upon, the method further comprises the steps of:

(1) for each of said symbols in said codeword:

(i) determining a first operational index of said symbol corresponding to the respective position of said symbol within a non-interleaved codeword, and (ii) performing a first operation upon one of said FIFOs identified by said first operational index of said symbol and a first predetermined criteria defining the location of said symbol in said electronic memory; and (2) for each of said symbols of said codeword, (i) determining a second operational index of a corresponding symbol in an interleaved codeword, and (ii) performing a second operation upon one of said FIFOs identified by said second operational index and a second predetermined criteria defining the location of said corresponding symbol in said electronic memory.

17. The method of claim 16, wherein said allocating step comprises the additional step of calculating the size of each of said predetermined number of FIFOs.

18. The method of claim 17, wherein said allocating step comprises the step of assigning to each of said predetermined number of FIFOs a portion of electronic memory in accordance with said calculating step.

19. The method of claim 17 wherein said calculating step for an interleaver includes the step of calculating the equation:

$$\text{FIFOsize}(i) = Xi*(i+1)$$

for each of said predetermined number of FIFOs, wherein i represents the logical position of one of each of said predetermined number of FIFOs and $X_i$ is calculated for each of said positions using the equation:

$$X_i = 1 + (((i+1)*N - 1) DIV\ D) - \sum_{i=0}^{i-1} X_j$$

wherein N represents the total number of symbols in any codeword, $$\sum_{i=0}^{i-1}$$

$X_j$ is the sum of elements whose indexes range from 0 to i−1 and wherein $$\sum_{i=0}^{i-1} X_j == 0 \text{ when } i = 0.$$

20. The method of claim 16, wherein said first predetermined criteria includes the steps of calculating:

$$\text{FIFO}(i) = (D*k) DIV\ N$$

wherein i represent the logical position of one of each of said predetermined number of FIFOs, k represents said first operational index and N presents the total number of symbols in any codeword.

21. The method of claim 16, wherein said first operation includes the step of reading a symbol from one of said predetermined number of FIFOs in the case of an interleaver and writing a symbol to one of said predetermined number of FIFOs in the case of a de-interleaver.

22. The method of claim 16, wherein said second operational index represents the position of said symbol to be operated upon in an interleaved codeword.

23. The method of claim 22, wherein said second operational index is calculated using the equation:

$$m = (D*k) \bmod (N)$$

wherein m represents said second operational index; k represents said first operational index and N represents the total number of symbols in any codeword.

24. The method of claim 22 wherein said second predetermined criteria includes the additional step of:

identifying the one of said predetermined number of FIFOs containing a symbol having said second operational index.

25. The method of claim 16, wherein said second operation comprises the step of writing a symbol from one of said predetermined number of FIFOs in the case of an interleaver and reading a symbol from one of said predetermined number of FIFOs in the case of a de-interleaver.

26. The method of claim 16, wherein said calculating step for a de-interleaver comprises the step of calculating the equation:

$$\text{FIFOsize}(i) = Xi*(D-1)$$

for each of said predetermined number of FIFOs, wherein i represents the logical position of one of each of said predetermined number of FIFOs and Xi is calculated for each of said logical positions using the equation:

$$Xi = 1 + (((i+1)*N - 1)DIVD) - \sum_{i=0}^{i-1} X_j$$

wherein N represents the total number of symbols in any codeword, $$\sum_{i=0}^{i-1}$$

$X_j$ is the sum of elements whose indexes range from 0 to i−1 and wherein $$\sum_{i=0}^{i-1} Xj == 0 \text{ where } j = 0.$$

27. An interleaver comprising: (1) an electronic memory configured into a predetermined number of FIFOs wherein each of said predetermined number of FIFOs outputs data in the order in which said data is input into each of said predetermined number of FIFOs; (2) an input port receiving a non-interleaved datastream of input codewords divided into indexed symbols; (3) an output port transmitting an interleaved datastream of output codewords; and (4) a control unit configuring said electronic memory into said predetermined number of FIFOs each of a predetermined size, said predetermined number of FIFOs being equal to the desired depth (D) of the interleave operation; for each of said input codewords, the control unit further:
   a) for each of the symbols of said input codeword,
      i) determines a first operational index of said symbol, and
      ii) writes said symbol into one of said predetermined number of FIFO identified by first operational index of the symbol using a first predetermined criteria defining the location of said symbol in said electronic memory; and
   b) for each of the symbols of said output codeword,
      i) determines a second operational index of said symbol; and
      ii) reads a symbol stored in one of said predetermined number of FIFOs identified by said second operational index using a second predetermined criteria defining the location of said symbol in said electronic memory.

28. A de-interleaver comprising: (1) an electronic memory configured into a predetermined number of FIFOs wherein each of said predetermined number of FIFOs outputs data in the order in which said data is input into each of said predetermined number of FIFOs; (2) an input port receiving an interleaved datastream of input codewords divided into indexed symbols; (3) an output port which outputs a non-interleaved datastream of output codewords; and (4) a control unit configuring said electronic memory into said predetermined number of FIFOs each of a predetermined size, said predetermined number of FIFOs being equal to the desired depth (D) of the interleave operation, for each of said output codewords, the control unit further:
   a) for each of the symbols of said output codeword,
      i) determines a first operational index of said symbol, and
      ii) reads said symbol of said output codeword from one of said predetermined number of FIFOs identified by said first operational index of said symbol using a first predetermined criteria defining the location of said symbol in said electronic memory; and
   b) for each of the symbols of said input codeword,
      i) determines a second operational index of said symbol; and
      ii) writes a symbol to one of said predetermined number of FIFOs identified by said second operational index using a second predetermined criteria defining the location of said symbol in said electronic memory.

* * * * *